United States Patent [19]
Jan

[11] Patent Number: 6,084,266
[45] Date of Patent: Jul. 4, 2000

[54] LAYOUT OF SEMICONDUCTOR DEVICES TO INCREASE THE PACKING DENSITY OF A WAFER

[75] Inventor: Tzong-Shi Jan, Hsinchu, Taiwan

[73] Assignee: Vanguard International Semiconductor Corporation, Hsinchu, Taiwan

[21] Appl. No.: 09/033,944

[22] Filed: Mar. 2, 1998

[51] Int. Cl.⁷ ................................................ H01L 31/119
[52] U.S. Cl. ........................ 257/341; 257/343; 257/401
[58] Field of Search ................................ 257/341, 343, 257/401

[56] References Cited

U.S. PATENT DOCUMENTS

| | | | |
|---|---|---|---|
| 4,636,825 | 1/1987 | Baynes | 357/23.14 |
| 4,821,084 | 4/1989 | Kinugasa et al. | 357/45 |
| 5,447,876 | 9/1995 | Moyer et al. | 437/41 |
| 5,672,894 | 9/1997 | Maeda et al. | 257/343 |

OTHER PUBLICATIONS

Wolf, Stanley, and Tauber, Richard, Silicon Processing for the VLSI Era, Lattice Press, 1986, pp. 476–489.

Primary Examiner—Sara Crane
Attorney, Agent, or Firm—Christensen O'Connor Johnson Kindness PLLC

[57] ABSTRACT

A first mask includes a plurality of vertical portions and a plurality of horizontal portions. The vertical portions and the horizontal portion are crossed, thereby forming a plurality of closed areas. A second mask is placed over the first mask that exposes the closed areas for forming sources and drains. A third mask formed over the closed areas to expose a portion of the closed areas for forming contact holes, and a fourth mask includes a first portion and a second separated portion, the first portion and the separated second portion cover the first contact holes.

11 Claims, 7 Drawing Sheets

LAYOUT OF SEMICONDUCTOR DEVICES TO INCREASE THE PACKING DENSITY OF A WAFER

FIELD OF THE INVENTION

The present invention relates generally to semiconductor manufacturing, and more specifically, to fabricating layers for forming semiconductor devices.

BACKGROUND OF THE INVENTION

The metal oxide semiconductor (MOSFET) transistor is one of the widely used devices in integrated circuits. The MOSFET device has a gate terminal, as well as source and drain terminals. The gate terminal is connected to the gate electrode, while the remaining terminals are connected to the heavily doped source and drain regions formed in the semiconductor substrate. A channel region in the semiconductor under the gate electrode separates the source and the drain.

FIG. 1 shows a schematic drawing of a layout of MOS transistors according to the prior art. A first region 10 is used to define the polysilicon gate of the MOS. The region 10 typically includes a plurality of first strip portions that are parallel to one another. A second strip portion is connected to those first strip portions and perpendicular to the first strip portions. A second region 12 is formed over the first region 10. The second region 12 is used for forming the impurity regions, i.e. the source and drain. The region 12 is divided into two major portions by the polysilicon gate. The first portions 12a of the second region 12 are utilized to form the source regions, while the remaining portions 12b are used to serve as the drain region. A third region 14 for forming contact holes is formed over the portions 12a of the second region 12. A fourth region 18 used to define a metal line is formed over the second region 12 and covers the third region 14. The contact region 14 can be used to create contact holes in an isolation layer, thereby providing an electrical path for connecting the source regions 12a via a metal line formed by using the fourth region 18. Similarly, the contact hole 16 can be also defined by the third region 14 or another region. The contact hole is used to provide an electrical path for connecting drains 12b.

The width of the polysilicon gate is denoted by "W" in FIG. 1. The junction between the polysilicon gate and the impurity region is denoted by "L". The ratio of W/L is preferably a higher number. In unit areas indicated by a-b-c-d, the ratio is 2W/L. However, the trends in the semiconductor industry is to fabricate integrated circuits that are scale down to an extremely compact dimensions and increase the packaging density of a wafer. Thus, it is desirable to layout a semiconductor device in a more compact dimension.

SUMMARY OF THE INVENTION

A first region for defining a polysilicon gate includes a plurality of vertical and horizontal strips structure. The vertical and horizontal strips are crossed with one another with a plurality of intersection points, thereby forming a plurality of rectangular or square areas. A second region serves as the cover to expose the rectangular or square areas. A third region is used to define a main structure includes a plurality of first oblique stripe structures and a plurality of second oblique stripe structures. The first oblique stripe structures are connected to the main structure. The remaining second oblique stripe structures are separated from the main structure. A plurality of contact hole formation region formed under the first oblique stripe structures connect to source regions. A plurality of second contact hole formation region are used to create contact holes in an isolation layer for electrically connecting to drain regions. A plurality of via formation regions are formed over the wafer to expose the areas that are over the intersection points of the polysilicon gate defined by the first region.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

A method is disclosed to provide a layout for fabricating a semiconductor device. The layout involves the arrangement of the polysilicon gate and the impurity regions. The layout of the present invention is not limited to forming the MOS transistor. It can be utilized, for example, to fabricate transistor cells in the electrical erasable programmable read only memory (EEPROM). The present invention will increase the packaging density of a wafer. The detail description of the present invention will be seen as follows.

Figure 2:
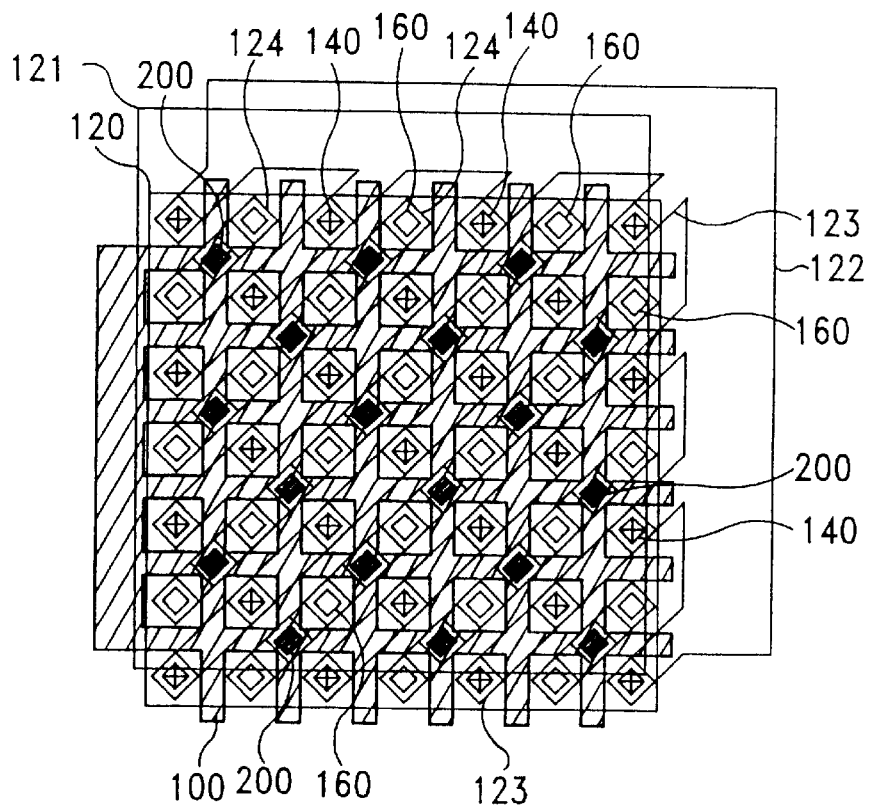
FIG. 2 is a schematic drawing illustrating the layout of MOSFET semiconductors in accordance with the present invention.
Figure 4:
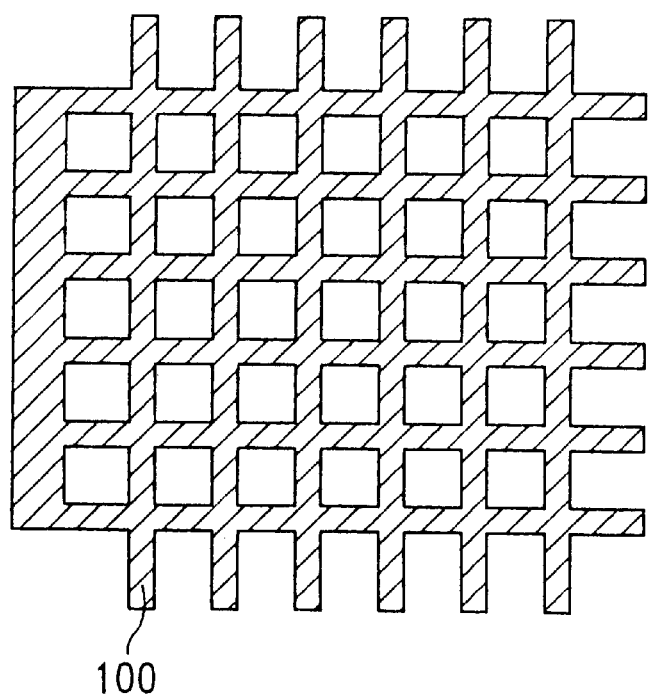
FIG. 4 is a schematic drawing illustrating the first mask for defining gates in accordance with the present invention.
Figure 5:
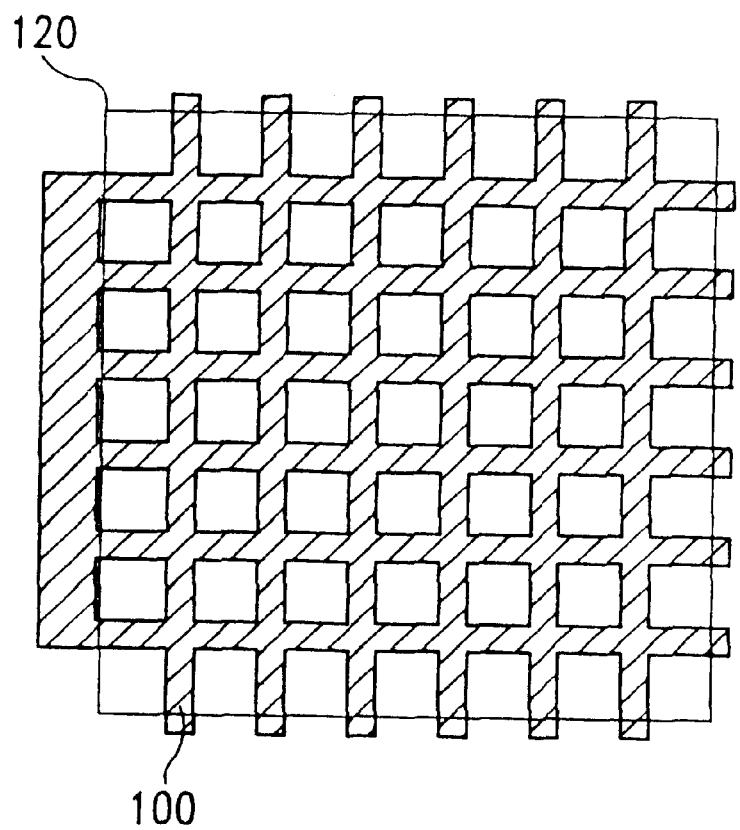
FIG. 5 is a schematic drawing illustrating the second mask for defining source and drain in accordance with the present invention.

Referring to FIG. 2, in the preferred embodiment, a first region 100 for defining a polysilicon gate includes a plurality of vertical and horizontal strips structure. Please see FIG. 4, The vertical and horizontal strips intersect with one another to create a plurality of intersection points between them, thereby forming a plurality of closed area in shapes of, for example, rectangulars or squares. A second region 120 serves as the cover to form a first and a second impurity regions i.e. source and drain, as shown in FIG. 5. To phrase in another way, rectangular or square areas used to form the impurity regions are exposed by the second region 120. The impurity regions are generated by well known technology. For example, ion implantation is performed using the second region 120 and the defined polysilicon gate as an ion implantation mask.

Figure 6:
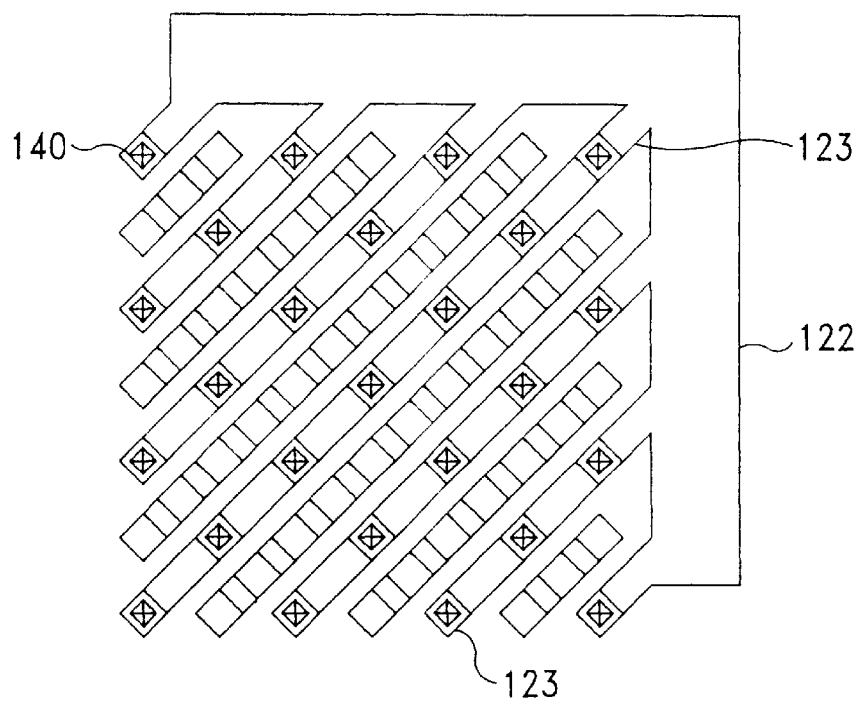
FIG. 6 is a schematic drawing illustrating the third mask and contact hole maask in accordance with the present invention.
Figure 7:
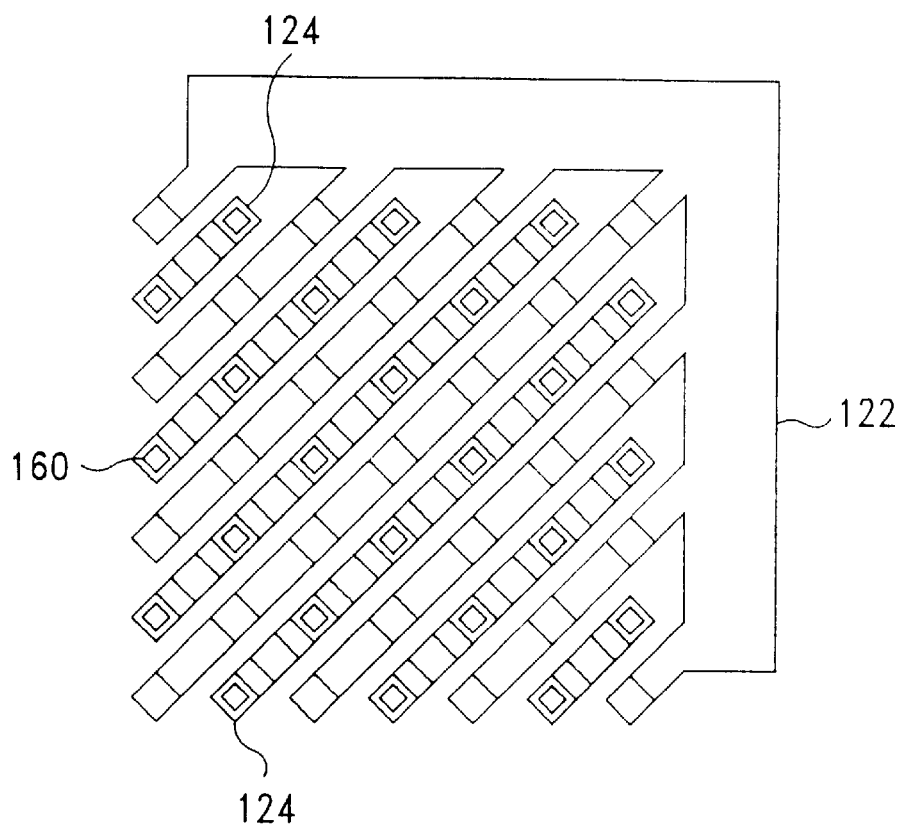
FIG. 7 is a schematic drawing illustrating the further contact hole mask in accordance with the present invention.

Turning to FIG. 6, a third region is used to define a main structure 122 (this is referred to metal 1) includes a plurality of first oblique stripe structures 123 and a plurality of second oblique stripe structures 124. The first oblique stripe structures 123 are connected to the main structure 122. The remaining second oblique stripe structures 124 are separated from the main structure 122. Further, the first oblique stripe structures 123 cover a portion of the impurity regions to define a conductive structure for connecting sources or drains. In a preferred embodiment, the first oblique stripe structures 123 are used to cover the areas over sources. Therefore, a plurality of contact hole formation region 140 are formed under the first oblique stripe structures 123 for connecting these sources. As well known in the art, contact holes are generated in an isolation layer using contact hole mask. The conductive structure can electrically contact with these sources via the contact holes. Similarly, the second oblique stripe structures 124 cover another portions of the impurity regions to define another conductive structure for connecting drains. Thus, a plurality of contact hole formation region 160 is used to create contact holes in an isolation layer for electrically connecting to drains, as shown in FIG. 7. The contact holes formation region 160 are formed under the second oblique stripe structures 124. Preferably, the first oblique stripe structures 123 and the second oblique stripe structures 124 are formed with a titled angle with 45 degrees respect to the polysilicon gates that are defined by the first region 100. As shown in FIG. 2, meal-2 region 212 are used to cover entire source or srain region.

Figure 8:
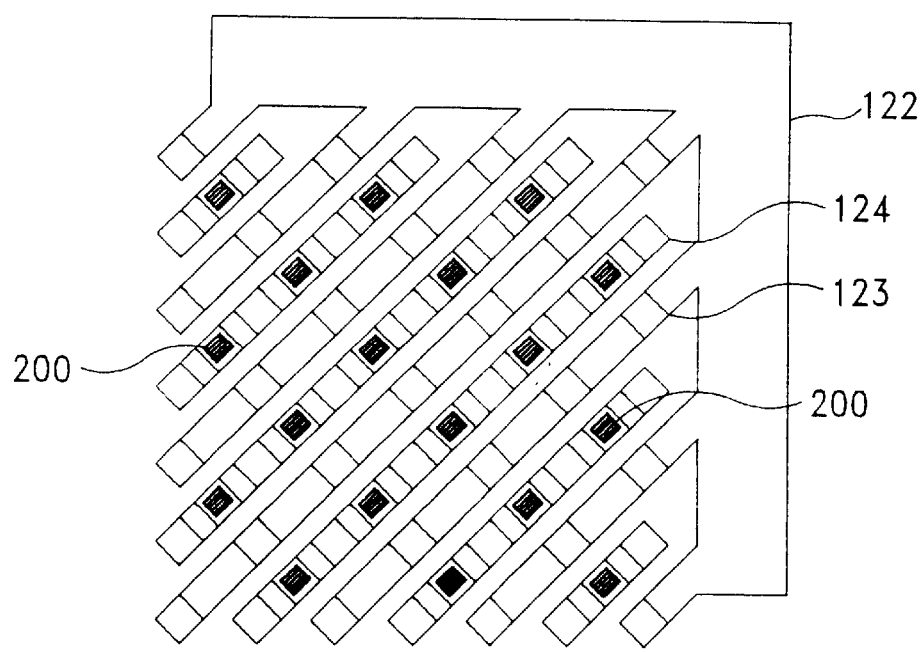
FIG. 8 is a schematic drawing illustrating the via hole mask in accordance with the present invention.

Referring to FIG. 2 and FIG. 8, a plurality of via hole formation region 200 are formed over the wafer (not shown) to expose the areas that are over the intersection points of the polysilicon gate as defined by the first region 100. The vias provide paths for connecting with the polysilicon gate. The region 121 used to define the metal-2 layer is shown in FIG. 2.

Figure 1:
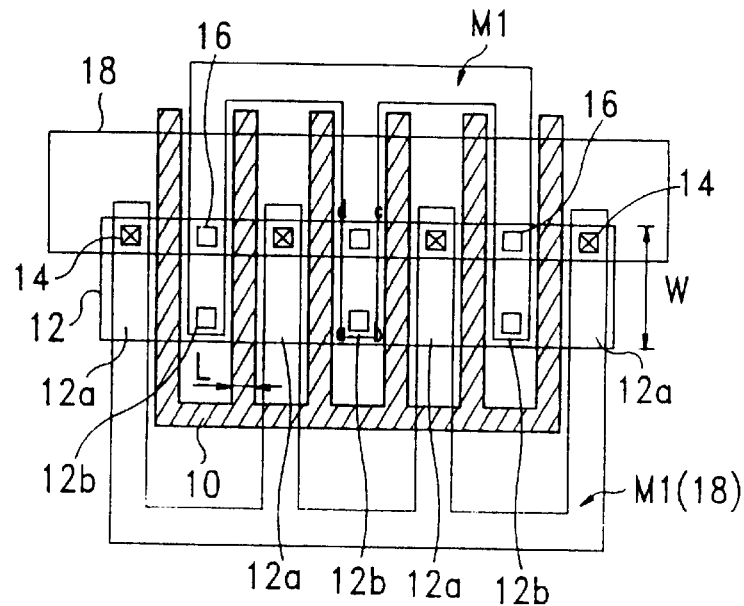
FIG. 1 is a prior art schematic drawing illustrating the layout of MOSFET.
Figure 3:
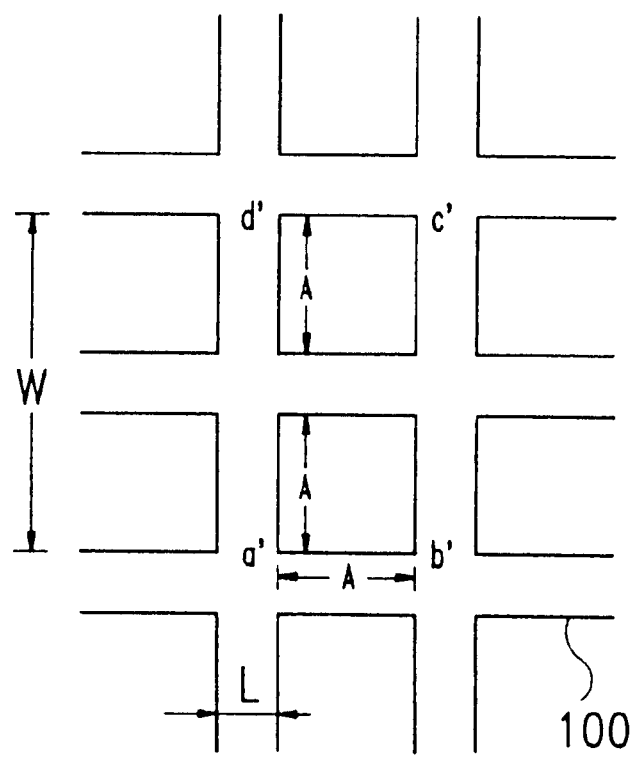
FIG. 3 is a schematic drawing illustrating the polysilicon gate in accordance with the present invention.

Turning to FIG. 3, it shows a portion of the polysilicon gates defined by the first region 100. The area defined by the a'-b'-c'-d is similarly defined as a-b-c-d in FIG. 1. Thus, the length of a'–d' represented by W is equal to the length of a–d in FIG. 1. The width of the polysilicon gate in FIG. 3 is also represented by "L" as in FIG. 1. The width of one "block" of the polysilicon gate is denoted by the symbol. In FIGS. 1 and 2, W=2A–L. The length of junction between the polysilicon gate and the impurity region in the area a'-b'-c'-d is about 8A–2L, a value which is larger than 2W. Thus, the ratio 8A–2L/L is greater than 2W/L. The packing density of a wafer is sufficiently increased by the present invention.

As is understood by a person skilled in the art, the foregoing preferred embodiment of the present invention is illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A layout structure of a semiconductor devices formed on a semiconductor wafer, said layout structure comprising:

a first region including a plurality of vertical portions and a plurality of horizontal portions to cover a portion of said semiconductor wafer for forming polysilicon gates, said vertical portions crossing said horizontal portion thereby forming a plurality of closed areas;

a second region formed over said first region that exposes said closed areas for forming first impurity regions and second impurity regions;

a third region formed over said closed areas exposing a portion of said closed areas for forming a plurality of first contact holes and a plurality of second contact holes;

a fourth region that includes first portions and second separated portions, said first portions covering said first contact holes, said second separated portions covering said second contact holes; and a fifth region formed over said fourth region and exposing the areas over the intersection points of said vertical portion and horizontal portion for forming a plurality of via holes.

2. The layout structure of claim 1, wherein said closed area is substantially rectangular.

3. The layout structure of claim 1, wherein said closed area is substantially square.

4. The layout structure of claim 1, wherein said first portions of said fourth region includes an oblique stripe structure that is connected to a main structure of said fourth region.

5. The layout structure of claim 1, wherein said second separated portions of said fourth region includes an oblique stripe structure that is not connected to said main structure of said fourth region.

6. The layout structure of claim 4, wherein said first portions of said fourth region are at a 45 degree angle with respect to said polysilicon gates.

7. The layout structure of claim 5, wherein said second separated portions of said fourth region are at a 45 degree angle with respect to said polysilicon gates.

8. The layout structure of claim 1, wherein said first impurity regions are drains.

9. The layout structure of claim 8, wherein said second impurity regions are sources.

10. The layout structure of claim 1, wherein said first impurity regions are sources.

11. The layout structure of claim 10, wherein said second impurity regions are drains.

* * * * *

UNITED STATES PATENT AND TRADEMARK OFFICE
CERTIFICATE OF CORRECTION

PATENT NO. : 6,084,266
DATED : July 4, 2000
INVENTOR(S) : T.-S. Jan

It is certified that error appears in the above-identified patent and that said Letters Patent is hereby corrected as shown below:

Columns 1-2,
Item [56], References Cited (U.S. Patents), insert the following in appropriate numerical order:

| | | |
|---|---|---|
| -- 4,209,716 | 06/1980 | Raymond, Jr. |
| 4,225,945 | 09/1980 | Kuo |
| 4,467,450 | 08/1984 | Kuo |
| 4,613,889 | 09/1986 | Kuo |
| 5,614,431 | 03/1997 | DeBrosse -- |

Signed and Sealed this

Ninth Day of October, 2001

Attest:

NICHOLAS P. GODICI
Attesting Officer
Acting Director of the United States Patent and Trademark Office